(12) United States Patent
Moku et al.

(10) Patent No.: US 6,979,844 B2
(45) Date of Patent: Dec. 27, 2005

(54) LIGHT-EMITTING SEMICONDUCTOR DEVICE AND METHOD OF FABRICATION

(75) Inventors: Tetsuji Moku, Asaka (JP); Kohji Ohtsuka, Kawagoe (JP); Masataka Yanagihara, Fujimi (JP); Masaaki Kikuchi, Kofu (JP)

(73) Assignee: Sanken Electric Co., Ltd., (JP)

( * ) Notice: Subject to any disclaimer, the term of this patent is extended or adjusted under 35 U.S.C. 154(b) by 0 days.

(21) Appl. No.: 10/394,687

(22) Filed: Mar. 21, 2003

(65) Prior Publication Data

US 2003/0183835 A1    Oct. 2, 2003

Related U.S. Application Data

(63) Continuation of application No. 09/958,822, filed as application No. PCT/JP01/01161 on Feb. 19, 2001, now abandoned.

(30) Foreign Application Priority Data

Feb. 21, 2000    (JP) .............................. 2000-42669

(51) Int. Cl.$^7$ ............................................. H01L 33/00
(52) U.S. Cl. .......................... 257/190; 257/97; 257/85; 257/13
(58) Field of Search ........................... 257/190, 85, 13, 257/97

(56) References Cited

U.S. PATENT DOCUMENTS

| 5,831,277 | A | * | 11/1998 | Razeghi | 257/15 |
| 6,110,277 | A | * | 8/2000 | Braun | 117/94 |
| 6,255,198 | B1 | * | 7/2001 | Linthicum et al. | 438/481 |
| 6,566,677 | B2 | * | 5/2003 | Kano et al. | 257/15 |

* cited by examiner

*Primary Examiner*—Jerome Jackson
(74) *Attorney, Agent, or Firm*—Woodcock Washburn LLP

(57) ABSTRACT

A low-resistance silicon baseplate (11) has formed thereon a buffer layer 12 in the form of an alternating lamination of AlN sublayers (12a) and GaN sublayers (12b). On this buffer layer there are formed an n-type semiconductor region (13) of gallium nitride, an active layer (14) of gallium indium nitride, and a p-type semiconductor region (15) of gallium nitride, in that order. An anode (17) is formed on the p-type semiconductor region (15), and a cathode (18) on the baseplate (11).

3 Claims, 1 Drawing Sheet

LIGHT-EMITTING SEMICONDUCTOR DEVICE AND METHOD OF FABRICATION

This is a continuation of application Ser. No. 09/958,822, filed Oct. 15, 2001 now abandoned which is a 371 of PCT/JP01/01161, filed Feb. 19, 2001.

TECHNICAL FIELD

This invention relates to a light-emitting semiconductor device composed primarily of gallium nitride (GaN)-based semiconductors, and to a method of making the same.

BACKGROUND ART

The compound semiconductors composed primarily of GaN have been used extensively for fabrication of light-emitting devices such as diodes that are capable of glowing in blue. Examples of such compound semiconductors include, in addition to GaN itself, gallium aluminum nitride (GaAlN), indium gallium nitride (InGaN), and indium gallium aluminum nitride (InGaAlN).

A typical prior art light-emitting device of the kind under consideration comprises a baseplate of electrically insulating material such as sapphire, a buffer layer overlying the baseplate and composed for example of $Ga_xAl_{1-x}N$, where x is greater than zero and not greater than one (as taught by Japanese Unexamined Patent Publication No. 4-297023), an n-type semiconductor region of GaN or other compound semiconductor composed principally of GaN and grown epitaxially on the buffer layer, an active layer of another compound semiconductor composed principally of GaN (e.g. InGaN) and grown epitaxially on the n-type semiconductor region, and a p-type semiconductor region grown epitaxially on the active layer. The n-type semiconductor region is connected to a cathode, and the p-type semiconductor region to an anode.

The common practice in the manufacture of light-emitting devices is first to form wafers on which there are fabricated matrices of desired devices, and to cut them into the individual devices as by dicing, scribing, or cleavaging. The noted sapphire baseplate of the light-emitting devices has been a cause of trouble in such dicing of the wafers because of its extreme hardness. Sapphire itself is expensive, moreover, adding much to the manufacturing costs of the light-emitting devices.

There have been additional difficulties in connection with the sapphire baseplate. Being electrically insulating, the sapphire baseplate makes it impossible to form a cathode thereon. This inconvenience was conventionally circumvented by exposing part of the n-type semiconductor region through the active layer and p-type semiconductor region for connection to a cathode. The results were a greater surface area of the semiconductor and a corresponding increase in the costs of the light-emitting devices.

A further inconvenience arose from the fact that current flows through the n-type semiconductor region not only vertically (normal to the plane of the sapphire baseplate) but horizontally (parallel to the sapphire baseplate plane). The dimension of the n-type semiconductor region for the horizontal current flow is as small as four to five micrometers, so that the resistance of the horizontal current path of the n-type semiconductor region was very high, adding substantively to the current and voltage requirements of the prior art devices.

A still further inconvenience concerns the etching-away of parts of the active layer and p-type semiconductor region in order to expose part of the n-type semiconductor region for connection to the cathode. The n-type semiconductor region had to be dimensioned sufficiently large to allow for some errors in etching, necessitating a correspondingly elongated period of time for it to be grown epitaxially.

It has been suggested to use a conductive baseplate of silicon carbide (SiC) in substitution for the sapphire. Permitting a cathode to be formed thereon, the SiC baseplate offers such advantages over the sapphire baseplate as a smaller surface area and easier separation of the wafer by cleavaging. Offsetting these advantages, however, is the fact that SiC is even more expensive than sapphire. Another shortcoming is the difficulty of placing the n-type semiconductor region in low-resistance contact with the SiC baseplate, so that the current and voltage requirements of the light-emitting device incorporating the SiC baseplate were just as high as those of the device with the sapphire baseplate.

The present invention aims at the provision of a light-emitting device, and a method of fabrication thereof, such that the device is efficiently manufacturable at a lower cost than heretofore and is improved in performance too.

DISCLOSURE OF THE INVENTION

The present invention will be briefly summarized with use of the reference characters used in the subsequent detailed description of the best mode of carrying out the invention. As used in this summary, however, the reference characters are meant purely for an easier understanding of the invention and should not be taken in a limitative sense.

Briefly stated in its perhaps broadest aspect, the light-emitting semiconductor device according to the invention comprises a baseplate (11) of low resistivity composed of a silicon compound or silicon with impurities, a buffer layer (12) formed on the baseplate and having a first sublayer (12a) of $Al_xGa_{1-x}N$, where x is greater than zero and not greater than one, and a second sublayer (12b) of GaN or $Al_yGa_{1-y}N$, where y is less than x and greater than zero and less than one, a semiconductor region (10) formed on the buffer layer and having a plurality of sublayers of compounds composed primarily of GaN or GaN-based compound semiconductors for emission of light, a first electrode (17) formed on the semiconductor region, and a second electrode (18) formed on the baseplate.

The sublayers of the semiconductor region (10) may include a first semiconductor sublayer (13) of a first conductivity type formed on the buffer layer (12) and made of a compound composed primarily of GaN, an active sublayer (14) on the first sublayer, and a second semiconductor sublayer (15) of a second conductivity type, which is opposite to the first conductivity type, formed on the active layer and also made of a compound composed primarily of GaN.

The buffer layer (12) may consist of an alternation of a first set of sublayers (12a) of AlxGa1–xN, and a second set of sublayers of GaN or AlyGa1–yN.

The first set of sublayers (12a) of the buffer layer 12 should each be from 5×10-4 to 100×10-4 micrometers, and the second set of sublayers thereof from 5×10-4 to 2000×10-4 micrometers.

The light-emitting semiconductor device of the above summarized configuration may be fabricated by a method comprising the steps of providing a baseplate (11) of a single crystal of silicon containing impurities and having a low resistivity, forming by a vapor phase growth on the baseplate (11) a buffer layer (12) in the form of an alternation of a first set of sublayers (12a) of AlxGa1–xN, where x is greater than zero and not greater than one, and a second set of sublayers (12b) of GaN or AlyGa1-yN, where y is less than x and more than zero and less than one, forming by vapor phase growth on the buffer layer a semiconductor region (10) containing a plurality of GaN-based compound semiconductor layers for emission of light, and forming a first electrode (17) on the semiconductor region (10) and a second electrode (18) on the baseplate (11).

The invention as set forth yields the following advantages:

1. Use of silicon or a silicon compound as the baseplate enables substantive reduction in the manufacturing cost of the light-emitting device.
2. The buffer layer, an alternation of AlxGa1-xN sublayers and GaN or Al yGa1-yN sublayers, conduces to improvement of the crystallinity and flatness of the overlying GaN-based compound semiconductor layers. The result is high efficiency with which light is emitted despite use of the cheap baseplate.
3. Being compounded of AlxGa1-xN sublayers and GaN or AlyGa1-yN sublayers, the buffer layer has a coefficient of thermal expansion intermediate that of the silicon or silicon compound baseplate and that of the GaN-based compound semiconductor region, thereby preventing or limiting the warping of the device due to a difference in coefficient of thermal expansion between the baseplate and the semiconductor region.
4. The two electrodes are disposed opposite each other, resulting in the lower resistance of the current path and in less current and voltage requirements.
5. Connection directly to the second electrode provides easy fabrication.

The invention provides a light-emitting device of even more favorable performance characteristics.

According to the invention, the buffer sublayers of AlxGa1-xN, which is relatively small in difference in lattice constraint from silicon, are provided one directly on the baseplate and another between the buffer sublayers of GaN or AlyGa1-yN, resulting in improvement in the flatness of the buffer layer and the crystallinity of the semiconductor region.

According to the invention, the first set of buffer sublayers are each so determined in thickness as to provide a tunnel effect in terms of quantum mechanics, limiting the resistance of the buffer sublayers and reducing the power and voltage requirements of the device.

The invention enables an easy and inexpensive fabrication of the light-emitting semiconductor device of the improved performance characteristics.

BEST MODE OF CARRYING OUT THE INVENTION

Figure 1:
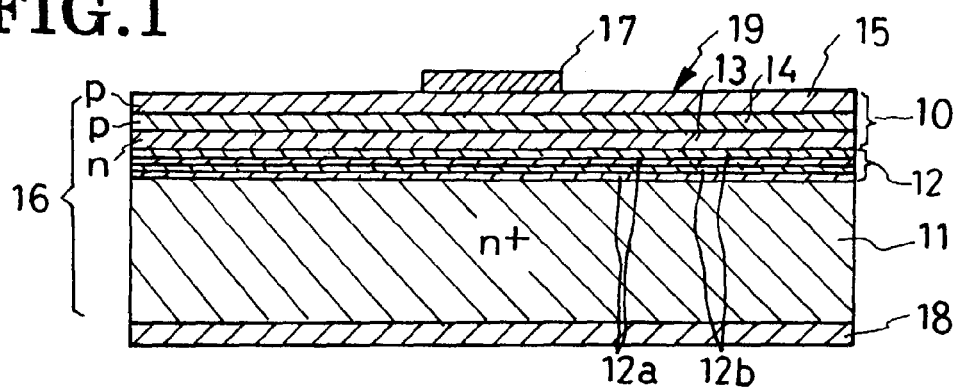
FIG. 1 is a section through the light-emitting diode embodying the principles of the present invention.
Figure 2:
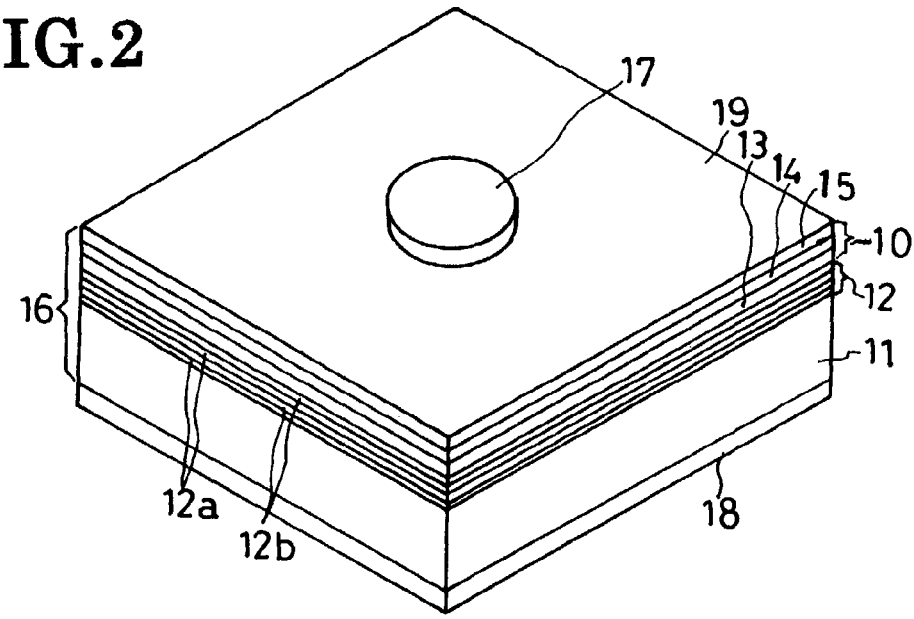
FIG. 2 is a perspective view of the light-emitting diode of FIG. 1.

The light-emitting semiconductor device according to the invention will now be described in detail in terms of the blue-light-emitting GaN-based compound diode illustrated in FIGS. 1 and 2. The exemplified blue LED comprises a semiconductor region 10 composed of a plurality of GaN-based compound semiconductor layers for emission of light, a substrate or baseplate 11 of a silicon semiconductor having a crystal plane (111), and a buffer layer 12. The light-emitting semiconductor region 10 comprises an n-type semiconductor region 13 composed of GaN, a p-type light-emitting or active layer 14 composed of InGaN, and a p-type semiconductor region 15 composed of GaN.

The lamination of the light-emitting semiconductor region 10, the baseplate 11 and the buffer layer 12 constitutes a substrate or base body 16. An anode 17 is formed on one of the two opposite major surfaces, or on the top as seen in the attached drawings, of the base body 16, or on the semiconductor region 15, and a cathode 18 on the other major surface, or on the bottom, of the base body. The buffer layer 12, the n-type semiconductor region 13, the active layer 14, and the p-type semiconductor region 15 are grown epitaxially on the baseplate 11, in that order and with their crystal orientation aligned.

The baseplate 11 is made of a single crystal of silicon containing impurities that determine its conductivity type. The baseplate 11 has an impurity concentration ranging from $5 \times 10^{18}$ cm$^{-3}$ to $5 \times 10^{19}$ cm$^{-3}$, and a resistivity ranging from 0.0001 ohm-cm to 0.01 ohm-cm. Made from n-type silicon into which is introduced arsenic, the baseplate 11 is low in resistivity that it serves as a current path between anode 17 and cathode 18. Additionally, being as thick as approximately 350 micrometers, the base-plate 11 functions as a support for the semiconductor region 10 and the buffer layer 12.

Thoroughly covering one surface of the baseplate 11, the buffer layer 12 is shown as an alternation of two buffer sublayers 12a and another two buffer sublayers 12b. In practice, however, the buffer layer may be constituted of as many as fifty sublayers 12a and another fifty sublayers 12b in alternation.

The first set of buffer sublayers 12a are made from substances that can be defined by the chemical formula, $Al_xGa_{1-x}N$, where x is greater than zero and equal to or less than one. Examples of such substances are aluminum nitride (AlN) and aluminum gallium nitride (AlGaN). The first set of buffer sublayers 12a are made from AlN (x being one in the general formula above) in this particular embodiment of the invention. Each such sublayer 12a is an extremely thin, electrically insulating film.

The second set of buffer sublayers 12b are extremely thin films of an n-type semiconductor that is either GaN or any of substances expressed by the formula, AlyGa1-yN, where y is less than x and greater than zero and less than one. In use of AlyGa1-yN for the second set of buffer sublayers 12b, it is recommended that y be made greater than zero and less than 0.8, in order to prevent an increase in the resistance of these sublayers.

The first set of buffer sublayers 12a should each have a thickness ranging from $5 \times 10^{-4}$ micrometers to $100 \times 10^{-4}$ micrometers, or 5–100 Angstroms, preferably from $10 \times 10^{-4}$ micrometers to $80 \times 10^{-4}$ micrometers. If less than five Angstroms in thickness, the first set of buffer sublayers 12a would fail to keep the overlying n-type semiconductor layer 13 sufficiently flat, and, if more than 100 Angstroms in thickness, would fail to provide the desired quantum-mechanical tunnel effect, resulting in an undue increase in the resistance of the buffer layer 12.

The second set of buffer sublayers 12b should each have a thickness ranging from $5 \times 10^{-4}$ micrometers to $2000 \times 10^{-4}$ micrometers, or 5–2000 Angstroms, preferably 10–300 Angstroms. If each less than five Angstroms in thickness, the second set of buffer sublayers 12b would fail to provide a desired degree of electrical connection between the neighboring sublayers 12a, causing an undesired increase in the resistance of the total buffer layer 12. If each more than 2000 Angstroms in thickness, on the other hand, the second set of buffer sublayers 12b might fail to hold the overlying n-type semiconductor layer 13 sufficiently flat.

Speaking more strictly, and in this particular embodiment of the invention, the two sets of sublayers 12a and 12b are each 50 Angstroms. The total thickness of the buffer layer 12 is therefore 5000 Angstroms.

A method of fabricating the light-emitting semiconductor device according to the invention will now be explained on the assumption that the first set of buffer sublayers 12a are of AlN, and the second set of buffer sublayers 12b are of GaN.

The known metal organic chemical vapor deposition (MOCVD) method is recommended for alternate fabrication of the AlN and GaN buffer sublayers. A monocrystalline silicon substrate or baseplate 11 may first be placed in a MOCVD reaction chamber to have oxide films removed from its surfaces by thermal annealing. Then a first buffer sublayer 12a of AlN may be formed to a thickness of approximately 50 Angstroms on one of the major surfaces of the baseplate 11 by introducing trimethyl aluminum (TMA) and ammonia ($NH_3$) gases into the reaction chamber for approximately twenty-seven seconds. Actually, after heating the baseplate 11 to 1120° C., the TMA gas, or aluminum in effect, was supplied at a rate of approximately sixty-three micromoles per minute, and the $NH_3$ gas, or $NH_3$ itself, at a rate of approximately 0.14 micromoles per minute.

Then, with the heating temperature of the baseplate 11 maintained at 1120° C., the supply of the TMA gas suspended, and the gases of trimethyl gallium (TMG), $NH_3$, and silane ($SiH_4$) were introduced instead into the reaction chamber for approximately fifteen seconds. There will thus be created a second buffer sublayer 12b of n-type GaN to a thickness of fifty Angstroms in overlying relationship to the first buffer sublayer 12a on the baseplate 11. The $SiH_4$ gas is intended for introduction of Si, an n-type impurity, into the sublayer being formed. The TMG gas, or Ga in effect, was introduced at a rate of approximately sixty-three micromoles per minute; the $NH_3$ gas, or $NH_3$ itself, at approximately 0.14 moles per minute; and the $SiH_4$ gas, or Si in effect, at approximately twenty-one nanomoles per minute.

In the case where there are fifty first buffer sublayers and fifty second buffer sublayers, as in this embodiment of the invention, the foregoing process of AlN sublayer creation may be repeated fifty times, and that of GaN sublayer creation as many times, in order to form a buffer layer 12 consisting of one hundred alternating AlN and GaN sublayers. These numbers should not, however, be taken in a limitative sense: The buffer layer may be constituted of, for instance, fifty alternating such sublayers.

Next comes the step of successively fabricating the n-type semiconductor region 13, active layer 14, and p-type semiconductor region 15 on the buffer layer 12 by the MOCVD method.

First, for formation of the n-type semiconductor region 13, the baseplate 11 with the buffer layer 12 thereon was put into the MOCVD reaction chamber, into which were then introduced TMG, $NH_3$, and $SiH_4$ gases. The $SiH_4$ gas is intended for introduction of Si, an n-type impurity, into the n-type semiconductor region 13. More specifically, the baseplate 11 with the buffer layer 12 thereon was heated to 1040° C. Then the TMG gas, or Ga in effect, was introduced at a rate of approximately 4.3 micromoles per minute; the $NH_3$ gas, or $NH_3$ itself, at approximately 53.6 millimoles per minute; and the $SiH_4$ gas, or Si in effect, at approximately 1.5 nanomoles per minute. The n-type semiconductor region 13 was thus formed to a thickness of approximately two micrometers.

It may be noted that the n-type semiconductor region 13 is very thin compared with the thickness, from four to five micrometers or so, of the conventional LEDs. The impurity concentration of the semiconductor region 13 was approximately $3 \times 10^{18}$ cm$^{-3}$, sufficiently less than that of the baseplate 11. The formation of the semiconductor layer 13 at as high a temperature as 1040° C. is possible thanks to the interposition of the buffer layer 12.

Then the active layer 14 of p-type InGaN was formed on the n-type semiconductor layer 13. To this end, with the heating temperature of the baseplate 11 set at 800° C., there were introduced into the reaction chamber both trimethyl indium gas (hereinafter referred to as the TMI gas) and bis-cyclo pentadienylmagnesium gas (hereinafter referred to as the $Cp_2Mg$ gas) in addition to TMG and $NH_3$ gases. The $Cp_2Mg$ gas was intended for introduction of Mg, a p-type impurity, into the active layer 14.

More specifically, for the fabrication of the active layer 14 as above, the TMG gas was introduced at a rate of approximately 1.1 micromoles per minute; the $NH_3$ gas at approximately sixty-seven millimoles per minute; the TMI gas, or In in effect, at approximately 4.5 micromoles per minute; and the $Cp_2Mg$ gas, or Mg, at approximately twelve nanomoles per minute. The active layer 14 thus formed had a thickness of approximately 20 Angstroms and an impurity concentration of approximately $3 \times 10^{17}$ cm$^{-3}$.

Then the p-type semiconductor region 15 of p-type GaN was formed on the active layer 14. The heating temperature of the baseplate 11 was raised to 1040° C. toward this end, and there were introduced into the reaction chamber TMG, $NH_3$, and $Cp_2Mg$ gases. The TMG gas introduced at approximately 4.3 micromoles per minute; the $NH_3$ gas at approximately 53.6 micromoles per minute; and the $Cp_2Mg$ gas at approximately 0.12 micromoles per minute. The thus-formed p-type semiconductor region 15 has a thickness of approximately 0.5 micrometers and an impurity concentration of approximately $3 \times 10^{18}$ cm$^{-3}$.

The MOCVD growth method set forth above has proved to make possible the fabrication of LEDs such that the crystal orientation of the monocrystalline silicon substrate or baseplate 11 is favorably followed by the buffer layer 12. Additionally, the n-type semiconductor region 13, active layer 14, and p-type semiconductor layer 15 are all aligned with the buffer layer 12 in crystal orientation.

Then, for formation of the first electrode or anode 17, nickel and gold were vacuum-deposited on the top of the semiconductor body 16, that is, on the p-type semiconductor region 15 in low-resistance contact therewith. Disc-like in shape as depicted in FIG. 2, the anode 17 is disposed centrally on the semiconductor body 16. That part 19 of the top surface of the semiconductor base body 16 which is left exposed by the anode 17 lends itself to emission of light.

The second electrode or cathode was formed on the entire bottom surface of the baseplate 11, as indicated at 18, rather than on the n-type semiconductor region 13. Vacuum deposition of titanium and aluminum was used for cathode formation.

In use of the blue LED fabricated as above, the cathode 18 may be mechanically and electrically connected, as by soldering or with use of an electrically conductive adhesive, to, for instance, an electrode on a circuit board. The anode 17 may be electrically coupled to an externalelectrode as by wire bonding.

Constructed and manufactured as in the foregoing, the blue LED according to the invention gains the following advantages:

1. The manufacturing costs of GaN-based semiconductor LEDs are reduced as the baseplates are made from silicon, which is far less expensive and far more easier of working upon than sapphire.

Figure 3:
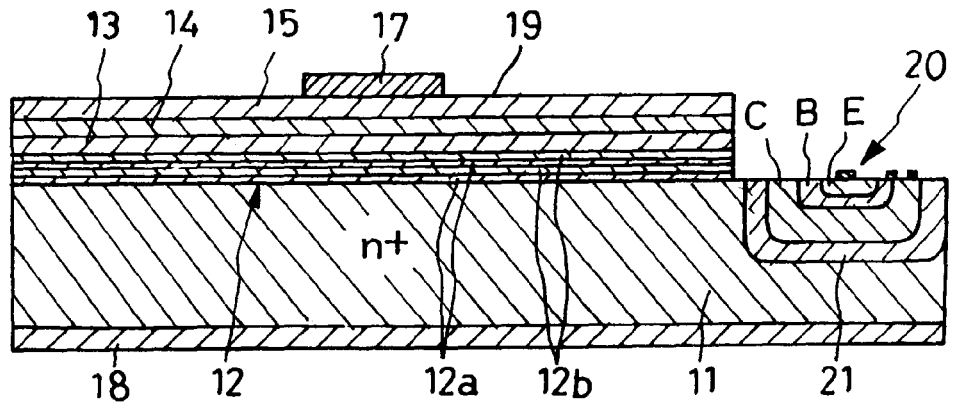
FIG. 3 is a section through a semiconductor device similar to that of FIGS. 1 and 2 but having another semiconductor device formed in its substrate.

2. The silicon baseplate 11 permits the fabrication of another electronic device or devices therein, making possible the provision of integrated semiconductor circuits in which GaN LEDs are incorporated with other semiconductor devices on one and the same semiconductor baseplate. In FIG. 3 is shown the LED largely constructed as in FIGS. 1 and 2 and having another semiconductor device such as a diode or a transistor 20 formed in the silicon baseplate 11 via a p-type semiconductor region 21. (The capitals B, C and E denote the base, collector, and emitter, respectively, of the transistor.) Such integration of light-emitting devices according to the invention with other semiconductor devices will provide smaller and cheaper composite devices.

3. The LED according to the invention is favorable in light-emitting characteristics and low in power requirement and operational resistance. Reasons for these performance characteristics will be set forth in the following:

3-1. Shown as an alternation of the first sublayers 12a of AlN and the second sublayers 12b of GaN, the buffer layer 12 favorably conforms to the crystal orientation of the underlying silicon baseplate 11. On this buffer layer 12, moreover, the GaN-based semiconductor region 10 comprising the n-type semiconductor region 13, active layer 14, and p-type semiconductor region 15 is formed with all their crystal orientation in alignment. Hence the favorable performance characteristics of the GaN semiconductor region 10 and so of the light-emitting characteristics of the LED 3-2. The semiconductor region 10 has its flatness improved by being formed on the baseplate 11 via the buffer layer 12 of the multiple AlN and GaN sublayers 12a and 12b. Should the buffer layer consist of a GaN semiconductor alone, no GaN semiconductor region of favorable flatness would be created on that buffer layer by reason of too much difference in lattice constant between silicon and GaN. The improved flatness of the GaN-based semiconductor region 10 according to the invention owes to the provision of the AlN sublayers 12a in alternation with the GaN sublayers 12b, the difference in lattice constant between silicon and AlN being much less than that between silicon and GaN. Improvement in the flatness of the GaN-based semiconductor region 10 leads directly to improvement in light-emitting characteristics.

3-3. Upon application of a forward voltage between anode 17 and cathode 18, such that the anode potential is higher than the cathode potential, forward current will flow between the two electrodes in the thickness direction of the semiconductor body 16. There will therefore be no current component flowing through the n-type semiconductor region 13 in a direction parallel to the plane of the baseplate 11, as has taken place in the prior art LEDs with the sapphire baseplates. Furthermore, as the anode 17 is disposed centrally of the semiconductor body 16, and the cathode 18 all over the underside of the semiconductor body, current will flow from anode 17 to cathode 18 all through the body of the semiconductor body 16, affording curtailment of current and voltage requirements.

3-4. The buffer layer 12 has its resistance value minimized as the AlN sublayers 12a of the buffer layer 12 are each so determined in thickness as to give rise to a quantum-mechanical tunnel effect. Being electrically insulating, the AlN sublayers 12a would make the buffer layer 12 inconveniently high in resistance if they were thicker than taught by the instant invention. According to the invention, however, the buffer layer 12 is sufficiently low in resistance partly because the AlN sublayers 12a are so thin as above and partly because they are laminated alternately with the electrically conductive GaN sublayers 12b. The results are low power requirement and low operational resistance.

4. The warping of the device due to a difference in the coefficient of thermal expansion between GaN-based semiconductor region 10 and baseplate 11 is minimized. Silicon and GaN are so different in the coefficient of thermal expansion that a considerable deformation of the device would arise if they were placed in direct contact with each other. In the blue LED disclosed above, however, the buffer layer 12 is constituted of the AlN sublayers 12a and GaN sublayers 12b that are so different in the coefficient of thermal expansion that the buffer layer has a mean coefficient of thermal expansion intermediate those of the GaN-based semiconductor region 10 and the silicon baseplate 11. Thus, thanks to the buffer layer 12, the LED is prevented from warping due to the difference in the coefficient of thermal expansion between GaN-based semiconductor region 10 and baseplate 11.

5. The cathode 18 is easier to form than with the prior art light-emitting devices having sapphire baseplates. Conventionally, the equivalents of the active layer 14 and p-type semiconductor region 15 have had to be partly removed to expose part of the n-type semiconductor region 13, and a cathode formed on this exposed part of the semiconductor region. The prior art devices have thus had the drawbacks of greater trouble in formation of the cathode and a greater exposed surface area of the n-type semiconductor region resulting from the cathode formation. The present invention defeats these drawbacks.

Possible Modifications

Notwithstanding the foregoing detailed disclosure, it is not desired that the present invention be limited by the exact details of such disclosure. The following is a brief list of possible modifications of the illustrated embodiments which are believed to fall within the purview of the instant invention:

1. The baseplate 11 could be made from polycrystalline silicon, instead of from monocrystalline silicon, or from a silicon compound such as silicon carbide.

2. The various layers of the semiconductor body 16 could be opposite in conductivity type to those specified above in connection with the illustrated embodiments.

3. The n-type semiconductor region 13, active layer 14, and p-type semiconductor region 15 could each be constituted of two or more semiconductor regions.

Industrial Applicability

The present invention provides LEDs and like light-emitting devices of low resistance and low power loss.

What is claimed is:

1. A light-emitting semiconductor device having a gallium nitride-based compound semiconductor, comprising:

(A) a baseplate made from a silicon containing impurities and having a low resistivity;

(B) a buffer layer formed on all of one major surface of said baseplate, said buffer layer comprising an alternating lamination of a plurality of first sublayers and second sublayers:

(a) each said first sublayer composed of $Al_xGa_{1-x}N$, where $0<x\leq1$, each-first sublayer having a thickness ranging from about $5\times10^{-4}$ micrometers to about $100\times10^{-4}$ micrometers and having a quantum-mechanical tunnel effect;

(b) each said second sublayer composed of GaN or $Al_yGa_{1-y}N$, where $y<x$ and $0<y<1$, each second sublayer containing n-type impurities comprising silicon and having an electrical conductivity and a thickness ranging from about $5\times10^{-4}$ micrometers to about $2000\times10^{-4}$ micrometers;

(C) a semiconductor region disposed on said buffer layer and containing a plurality of gallium nitride-based compound semiconductors for emission of light;

(D) a first electrode connected to said semiconductor region; and (E) a second electrode connected to another major surface of said baseplate.

2. The light-emitting semiconductor device as claimed in claim 1, wherein said semiconductor region comprises:

(a) an n-type semiconductor region formed on said buffer layer and composed of a gallium nitride-based compound;

(b) an active layer formed on said n-type semiconductor region; and (c) a p-type semiconductor region formed on said active layer and composed of a gallium nitride-based compound.

3. A method of fabricating a light-emitting semiconductor device having a gallium nitride-based composed semiconductor, comprising the steps of:

(a) providing a baseplate of monocrystalline silicon containing impurities and having a low resistivity;

(b) forming on all of one major surface of said baseplate a buffer layer in the form of an alternation of a first set of sublayers and a second set of sublayers by a vapor phase growth method, each of said first sublayers being composed of $Al_xGa_{1-x}N$, where $0<x<1$, and having a thickness ranging from about $5\times10^{-4}$ micrometers to about $100\times10^{-4}$ micrometers and having a quantum-mechanical tunnel effect, each of said second sublayers being composed of GaN or $Al_yGa_{1-y}N$, where $y<x$ and $0<y<1$, and containing n-type impurities comprising silicon and having an electrical conductivity and having a thickness ranging from about $5\times10^{-4}$ micrometers to about $2000\times10^{-4}$ micrometers;

(c) forming on said buffer layer by a vapor phase growth method a semiconductor region composed of a plurality of gallium nitride-based compound layers for emission of light; and (d) forming a first electrode on a surface of said semiconductor region, and a second electrode on another major surface of said substrate.

* * * * *